United States Patent [19]

Takagi et al.

[11] 4,354,909
[45] Oct. 19, 1982

[54] PROCESS FOR PRODUCTION OF MAGNETIC RECORDING MEDIUM

[75] Inventors: Toshinori Takagi, Nagaokakyo; Shinsaku Nakata, Toyonaka; Kazuhiko Kanki, Uji; Masahiro Hotta, Osaka, all of Japan

[73] Assignee: Sekisui Kagaku Kogyo Kabushiki Kaisha, Osaka, Japan

[21] Appl. No.: 124,235

[22] Filed: Feb. 25, 1980

[30] Foreign Application Priority Data

Feb. 23, 1979 [JP] Japan .................................. 54-20957
Apr. 2, 1979 [JP] Japan .................................. 54-39685
Apr. 2, 1979 [JP] Japan .................................. 54-39686

[51] Int. Cl.$^3$ .......................................... C23C 15/00
[52] U.S. Cl. .............................. 204/192 N; 427/38; 427/39; 427/40; 427/42; 427/48; 427/128; 427/132; 427/250; 427/255; 427/255.3; 427/295; 427/296

[58] Field of Search .......................... 427/128–132, 427/48, 42, 38, 39, 40, 250, 255, 255.3, 295, 296; 428/900, 694; 204/192 N

[56] References Cited

U.S. PATENT DOCUMENTS 4,152,478  5/1979  Takagi ................................ 427/42
4,226,681 10/1980  Shirahata et al. ................... 427/132

Primary Examiner—Bernard D. Pianalto
Attorney, Agent, or Firm—Wenderoth, Lind & Ponack

[57] ABSTRACT

A magnetic recording medium comprising a non-magnetic substrate such as polyethylene terephthalate film, and deposited on the surface of the substrate by an ionized cluster beam deposition method, at least one ferro-magnetic material selected from the group consisting of cobalt, cobalt-containing alloys, mixtures of cobalt with other elements, and chromium dioxide; and a process for production thereof. The magnetic recording medium is characterized by having superior magnetic properties, especially superior coercive force, residual magnetic flux density and squareness ratio, and high mechanical strength.

6 Claims, 2 Drawing Figures

PROCESS FOR PRODUCTION OF MAGNETIC RECORDING MEDIUM

This invention relates to magnetic recording media such as magnetic tapes, magnetic discs and magnetic drums. These magnetic recording media have conventionally been produced by dispersing a powdery magnetic material such as gamma-iron oxide and chromium oxide in a resin binder, and coating the resulting dispersion on a substrate such as a polyethylene terephthalate or aluminum substrate. With these magnetic recording media, however, high-density recording is impossible because there is a limit to the minimum particle diameter of the powdery magnetic material which can be attained and the thickness of the recording layer cannot be reduced.

In an attempt to obtain magnetic recording media capable of achieving high-density recording, methods were developed which involve depositing a ferromagnetic material on a substrate such as polyethylene terephthalate by vacuum deposition, ion-sputtering, ion-plating, etc. The magnetic layer formed by the vacuum deposition method, however, undergoes pelling, wear, damage, etc. upon application of friction, and cannot be repeatedly used, because the magnetic particles are deposited at a low density and the bond strength between the magnetic layer and the substrate is low. On the other hand, since the ion-plating or sputtering method is carried out under a low vacuum of from $10^{-1}$ to $10^{-3}$ torr, the magnetic layer deposited unavoidably contains impurities, and therefore has poor crystallinity and a low squareness ratio.

It is an object of this invention to provide a magnetic recording medium which has high abrasion resistance and superior magnetic properties such as coercive force, residual magnetic flux density and squareness ratio and in which the ferromagnetic layer of high packing density firmly adheres to the substrate.

This object can be achieved in accordance with this invention by a magnetic recording medium comprising a substrate composed of a non-magnetic material, and deposited on the substrate by an ionized cluster beam deposition method, at least one ferromagnetic material selected from the group consisting of cobalt, cobalt-containing alloys, mixtures of cobalt with other elements, and chromium dioxide.

When the ferromagnetic material is cobalt, a cobalt-containing alloy or a mixture of cobalt and another element, the magnetic recording medium of this invention can be produced by heating a closed type crucible having an injection nozzle and containing at least one ferro-magnetic material selected from cobalt, cobalt-containing alloys and mixtures of cobalt with other elements in a vacuum chamber kept at $10^{-3}$ torr to $10^8$ torr thereby to generate a cluster of the atoms of the ferromagnetic material from the injection nozzle, impinging electron beams generated by an electron beam generator provided within the same vaccum chamber against the cluster to ionize it, accelerating the generated cluster ions in an electric field, and depositing them on a substrate composed of a non-magnetic material (to be referred to as the process of embodiment I).

When the ferromagnetic material is chromium dioxide, the magnetic recording medium of this invention can be produced by supplying oxygen to the vicinity of the injection nozzle when the crucible is heated in the process of embodiment I. Specifically, it can be produced by heating a sealed crucible having an injection nozzle and containing metallic chromium or chromium oxide and simultaneously supplying oxygen to the vicinity of the injection nozzle in a vacuum chamber kept at $10^{-3}$ torr to $10^{-8}$ torr thereby to generate a cluster composed mainly of chromium or chromium oxide, impinging electron beams generated by an electron beam generator provided within the same vacuum chamber against the cluster thereby to ionize it, accelerating the generated cluster ions in an electric field, and depositing them on a substrate (to be referred to as the process of embodiment II).

The ionized cluster beam deposition method, as used in the present invention, denotes a method which comprises heating a closed type crucible having an injection nozzle and containing a material capable of forming a ferromagnetic film in a highly evacuated vacuum chamber kept at $10^{-3}$ torr to $10^{-8}$ torr while, if desired, supplying oxygen to the vicinity of the injection nozzle, increasing the vapor pressure within the crucible to $10^{-2}$ torr or higher thereby to jet out a vapor of the material from the injection nozzle to form a cluster composed of 500 to 2,000 atoms of the aforesaid material, ionizing the cluster by impingement of electrons to form cluster ions, concentrating and accelerating the cluster ions by a field effect to form cluster ion beams having imparted thereto a high energy of several eV to several thousand eV, and impinging the cluster ion beams against the surface of the substrate to form a thin film of the aforesaid material thereon. According to the cluster ion beam depositing method, a magnetic thin film having good crystallinity can be obtained because it is formed by a migration effect in which cluster ions composed mainly of ferromagnetic metal atoms, when impinged against the surface of the substrate, separate into the individual atomic particles by the energy of impingement and migrate on the surface of the substrate, a self heating effect on the surface of the thin film in which a part of the energy generated upon the impingement against the surface of the substrate is converted to heat energy to cause a localized temperature rise, a chemically activating effect by the presence of ions, etc. Moreover, since this method does not require any operation of heating the substrate owing to the aforesaid effects, it can be applied conveniently to the production of magnetic recording media comprising as a substrate polymeric materials having a low softening temperature such as polyethylene terephthalate.

The magnetic layer deposited on the surface of the substrate by the ionized cluster beam depositing method is of high packing density, firmly adheres to the substrate, and has a smooth surface. Hence, this layer exhibits superior magnetic properties. When the aforesaid cluster ion beam deposition method is carried out in the presence of a magnetic field applied in a direction parallel to the substrate surface, the axis of easy magnetization of the ferromagnetic material in the deposited film layer is oriented and distributed in the direction of the magnetic field, and the magnetic properties such as coercive force, residual magnetic flux density and squareness ratio of the magnetic layer can be further improved. According to another aspect of the invention, therefore, there is provided a process for producing a magnetic recording medium, which comprises depositing at least one ferro-magnetic material selected from the group consisting of cobalt, cobalt-containing alloys and mixtures of cobalt with other elements on the surface of a substrate composed of a non-magnetic material by cluster ion beam deposition in the presence of a magnetic field applied in a direction parallel to the surface of said substrate (the process of embodiment III).

The ferromagnetic material used in the magnetic recording medium of this invention is at least one member selected from cobalt, cobalt-containing alloys, mixtures of cobalt with other elements, and chromium dioxide. Examples of the cobalt-containing alloys include binary alloys such as alloys of cobalt with phosphorus, chromium, copper, nickel, iron, manganese, gold, silicon, titanium, yttrium, bismuth, lanthanum, or praseodymium, and ternary alloys such as nickel-cobalt-phosphorus alloy or cobalt-bismuth-phosphorus alloy. Examples of the mixtures of cobalt with other elements include mixtures of cobalt with phosphorus, chromium, copper, nickel, iron, manganese, gold, silicon, titanium, yttrium, bismuth, lanthanum, and/or praseodymium. Alloys or mixtures consisting predominantly of cobalt are preferred. A cobalt-chromium alloy or mixture containing not more than 25% by weight of chromium is especially preferred.

The substrate used in this invention is composed of a non-magnetic material. The shape of the substrate may be determined depending upon the manner in which the resulting magnetic recording medium is to be used, and includes, for example, tapes, films, disks, drums, etc. Examples of the non-magnetic material as the substrate are polymeric materials such as polyethylene terephthalate, polybutylene terephthalate, polyethylene, polypropylene, polyvinyl chloride, polyvinyl fluoride, cellulose acetate, cellulose butyl acetate, polycarbonate, polyimides, polyether sulfone and polyparabanic acid; ceramic materials such as glass, porcelain and ceramics; and non-magnetic metal materials such as aluminum, copper and a copper-zinc alloy.

The thickness of the deposited layer is not limited in particular. Usually, it is 0.01 to 10 microns, preferably 0.05 to 10 microns, more preferably 0.1 to 1 micron.

The present invention is described below more specifically with reference to the accompanying drawings, in which:

DETAILED DESCRIPTION OF THE DRAWING

Figure 1:
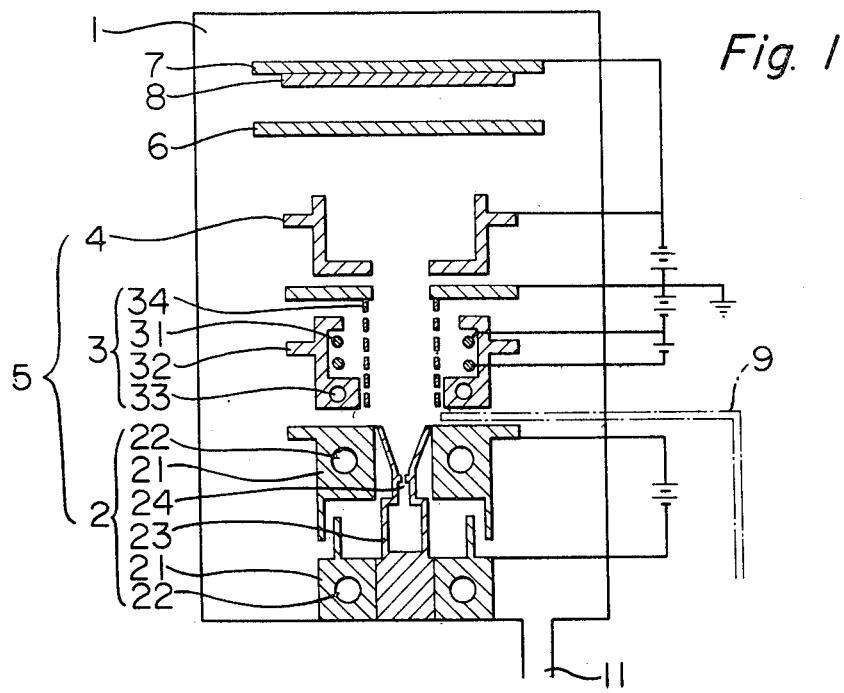
FIG. 1 is a diagrammatic view showing an example of an ionized cluster beam deposition apparatus used in this invention.

Referring to FIG. 1, the reference numeral 1 represents a vacuum chamber having an exhaust port 11 to which a vacuum pump is connected. The vacuum chamber 1 includes a cluster ionizing gun unit 5 consisting of a cluster generator 2, an ionizing device 3 and a cluster ion accelerating electrode 4; a shutter 6; and a substrate holder 7. The cluster generator 2 is made up of an electrode 21 having a cooling mechanism 22 and a closed type crucible 23 having an injection nozzle 24 of a small diameter. The ionizing device 3 consists of filaments 31 for releasing hot electrons, a mesh electrode 34 for accelerating the released electrons in an electric field, and a guard 32 for controlling the electric field which has a cooling means 33.

In the production of a magnetic recording medium using cobalt, a cobalt-containing alloy or a mixture of cobalt and another element (the process of embodiment I), a substrate 8 is set at the substrate holder 7, and the ferromagnetic material to be deposited is fed into the crucible 23. The vacuum chamber is evacuated through the exhaust port 11 to maintain a high vacuum of $10^{-3}$ torr to $10^{-8}$ torr therein. Then, an electric current is passed through the electrode 21 to heat the closed type crucible 23. Thus, the ferromagnetic material supplied to the crucible 23 is heated so that its vapor pressure reaches $10^{-2}$ torr to several torr. The ratio of the "pressure in the vacuum chamber" to the "pressure in the crucible 23" is prescribed at less than 1/100, whereupon the vapor of the ferromagnetic material is jetted out from the injection nozzle 24 to form a cluster composed of the atoms of the ferromagnetic material. In the ionizing device 3, the filaments 31 are heated by the passing of electric current to release electrons. The released electrons are accelerated by the earthed mesh electrode 34 and the filaments 31 to which a direct-current voltage of $-100$ V to $-1000$ V has been applied. The accelerated electrons collide with the cluster to ionize it and thus form cluster ions. The cluster ions are accelerated in the direction of the substrate 8 by the cluster ion accelerating electrode 4 to which a direct-current voltage of $-0.1$ KV to $-15$ KV has been applied. Normally, the cluster ions are shielded by the shutter. When the generation of cluster ions becomes uniform, the shutter 6 is removed to allow the cluster ions to collide with the substrate 8. As a result, a uniform deposited film of the ferromagnetic material is formed on the substrate. Since the adhesion between the ferromagnetic layer deposited by cluster ions and the substrate becomes better at higher voltages of the cluster ion accelerating electrode, it is preferred that the early stage of the ionized cluster beam deposition be carried out at a high voltage of $-4$ KV to $-15$ KV, and after the thin layer of the cluster ions is formed on the substrate, the deposition be carried out at a low voltage of $-0.1$ KV to $-4$ KV. Preferably, the cluster ion accelerating electrode 4 is connected by a wire to the substrate holder 7 so that they have the same potential.

To produce a magnetic recording medium using chromium dioxide as the ferromagnetic material (the process of embodiment II), the same operation as in the process of embodiment I can be employed except that metallic chromium or chromium oxides ($CrO$, $Cr_2O_3$, $CrO_2$, $Cr_2O_5$, $CrO_3$, etc.) are fed into the crucible 23, and a vapor of metallic chromium or chromium oxide is jetted out into an oxygen atmosphere supplied from an oxygen supplying device 9 (shown by the chain line in FIG. 1) thereby to form a cluster composed of chromium dioxide molecules. Preferably, the metallic chromium and chromium oxides have as high a purity as possible. Metallic chromium of high purity is most preferred. Oxygen is also desirably of high purity. The amount of oxygen is prescribed so that the pressure in the vacuum chamber 1 does not exceed $10^{-3}$ torr.

In the performance of the process of embodiment III, a plate-like permanent magnet is used as the substrate holder 7 in the process of embodiment I. Consequently, the cluster ions are impinged against the substrate 8 while their axis of easy magnetization is being oriented by the magnetic field applied in a direction parallel to the surface of the substrate holder (permanent magnet), i.e. in a direction parallel to the surface of the substrate 8. Since according to the process of this embodiment the cluster ions are impinged against the substrate in the presence of a magnetic field applied in a direction parallel to the surface of the substrate, the ferromagnetic material is deposited in a high density on the substrate without involving other substances. Furthermore, the axis of easy magnetization of the ferromagnetic material is oriented and distributed in the direction of the magnetic field, and there can be obtained a magnetic recording medium having especially superior magnetic properties such as coercive force, residual magnetic flux density and squareness ratio.

Since the ferromagnetic material is deposited on the non-magnetic material by ionized cluster beam deposition in the process of this invention, no significant amount of electric charge builds up even on the surface of an insulating substrate, and the rise in the temperature of the substrate is small. Accordingly, in the process of this invention, low-melting materials or electrical insulating materials can also be used conveniently as the substrate. Furthermore, since the cluster ion beam deposition is carried out in a high vacuum, and the kinetic energy of the cluster ions is uniform and large, the ferromagnetic material is deposited on the surface of the substrate without involving other substances. The deposited layer has a smooth surface and a high packing density, and firmly adheres to the substrate.

The ferromagnetic material used in this invention is cobalt, a cobalt-containing alloy, a mixture of cobalt with another element, or chromium dioxide, and adheres intimately and firmly to the substrate as a smooth layer. Accordingly, the magnetic recording medium of this invention has superior magnetic properties such as coercive force, residual magnetic flux density and squareness ratio, and the ferromagnetic layer has high mechanical strength. Hence, the ferromagnetic layer does not easily undergo peeling, wear or damage even when it is scanned in contact with a magnetic head. Furthermore, because the surface of the ferromagnetic layer is smooth, the wear of the magnetic head is also small.

Accordingly, the magnetic recording media of this invention are useful as magnetic tapes such as open reel tapes, cassette tapes and video tapes, and in the field of digital recording as magnetic disks, magnetic cards, magnetic tickets, magnetic notebooks and magnetic drums.

The following Examples specifically illustrate the present invention.

EXAMPLE 1

An ionized cluster beam depositing device of the type shown in FIG. 1 was used. The closed type crucible 23 was charged with 9.5 g of cobalt lumps (purity 99.99%) and 0.5 g of chromium lumps (purity 99.99%). A polyethylene terephthalate film having a thickness of 25 microns was secured as a substrate to substrate holder 7. Ionized cluster beam deposition was performed under the conditions shown in Table 1. Shutter 6 is removed when the generation of cluster ions became uniform.

The thickness of the cobalt-chromium deposited layer in the resulting magnetic recording medium was about 2300 Å when measured by a thickness gauge of the multiple-beam interferometer type. The adhesion strength between the cobalt-chromium deposited layer and the polyethylene terephthalate film was about 40 kg/cm². (The adhesion strength was measured by bonding a copper plate of a square shape with each side measuring 5 mm having a smooth surface to the deposited alloy layer, and peeling the copper plate in a direction of 90° by an autograph). When a cellophane tape was bonded to the deposited layer and subjected to a 180° peeling test, no peeling of the deposited layer occurred.

To examine the magnetic properties of this magnetic recording medium, its saturation magnetic flux density, residual magnetic flux density, coercive force and squareness ratio were measured. The results are shown in Table 2.

TABLE 1

| Conditions for ionized cluster beam deposition | | |
|---|---|---|
| Vacuum conditions | Initial degree of vacuum | $5 \times 10^{-6}$ torr |
| | Degree of vacuum during deposition | $7 \times 10^{-6}$ torr |
| | Material | High purity carbon |
| Crucible conditions | Diameter of the injection nozzle | 0.1 mm |
| | Temperature | 1750° C. |
| | Pressure in the crucible | about $2 \times 10^{-1}$ torr |
| Cluster ionization conditions | Ionizing voltage | −600 V |
| | Ionizing current | 100 mA |
| Cluster ion accelerating conditions | Accelerating voltage | −5 KV |
| | Ion current | 20 μA |

TABLE 2

| Magnetic properties | |
|---|---|
| Saturation magnetic flux density | 2870 gauss |
| Residual magnetic flux density | 2300 gauss |
| Coercive force | 120 oersteds |
| Squareness ratio | 0.80 |

EXAMPLE 2

Ten grams of chromium lumps (purity 99.99%) were fed into a closed type crucible, and in the same way as in Example 1, a deposited layer having a thickness of about 200 Å was formed on a polyethylene terephthalate film. Then, 10 g of cobalt lumps (purity 99.99%) and 0.1 g of chromium lumps were fed into the closed type crucible, and cluster ion beam deposition was carried out under the conditions shown in Table 3.

The thickness of the cobalt-chromium deposited layer, measured by the same method as in Example 1, was about 1500 Å.

The adhesion strength between the deposited layer and the substrate, measured in the same way as in Example 1, was about 55 kg/cm². When the resulting magnetic recording medium was subjected to a 180° peeling test using a cellophane tape, the deposited layer was not peeled off at all.

The magnetic properties of the resulting magnetic recording medium were measured in the samme way as in Example 1, and the results are shown in Table 4.

TABLE 3

| Ionized cluster beam deposition conditions | | |
|---|---|---|
| Vacuum conditions | Initial degree of vacuum | $5 \times 10^{-4}$ torr |
| | Degree of vacuum during deposition | $6.5 \times 10^{-6}$ torr |
| | Material | High purity carbon |
| Crucible conditions | Diameter of the injection nozzle | 0.15 mm |
| | Temperature | 1800° C. |
| | Pressure in the crucible | about $4 \times 10^{-1}$ torr |
| Cluster | Ionizing voltage | −600 V |

TABLE 3-continued

| Ionized cluster beam deposition conditions | | |
|---|---|---|
| ionization conditions | Ionizing current | 300 mA |
| Cluster ion accelerating conditions | Accelerating voltage | −2KV |
| | Ion current | 20 μA |

TABLE 4

| Magnetic properties | |
|---|---|
| Saturation magnetic-flux density | 6470 gauss |
| Residual magnetic flux density | 5440 gauss |
| Coercive force | 460 oersteds |
| Squareness ratio | 0.84 |

EXAMPLE 3

In a cluster ion beam depositing apparatus of the type shown in FIG. 1, 9.5 g of cobalt lumps (purity 99.99%) and 0.5 g of chromium lumps (purity 99.99%) were fed into closed type crucible 23, and a polyethylene terephthalate film having a thickness of 25 microns was secured as a substrate to a substrate holder made of a permanent magnet. Cluster ion beam deposition was carried out under the conditions shown in Table 5. The shutter 6 was removed when the generation of cluster ions became uniform. The permanent magnet as the substrate holder 7 had a magnetic field of about 1200 oersteds in a direction parallel to the surface of the substrate.

The thickness of the cobalt-chromium deposited layer in the resulting magnetic recording medium, measured by the same method as in Example 1, was about 700 Å.

Figure 2:
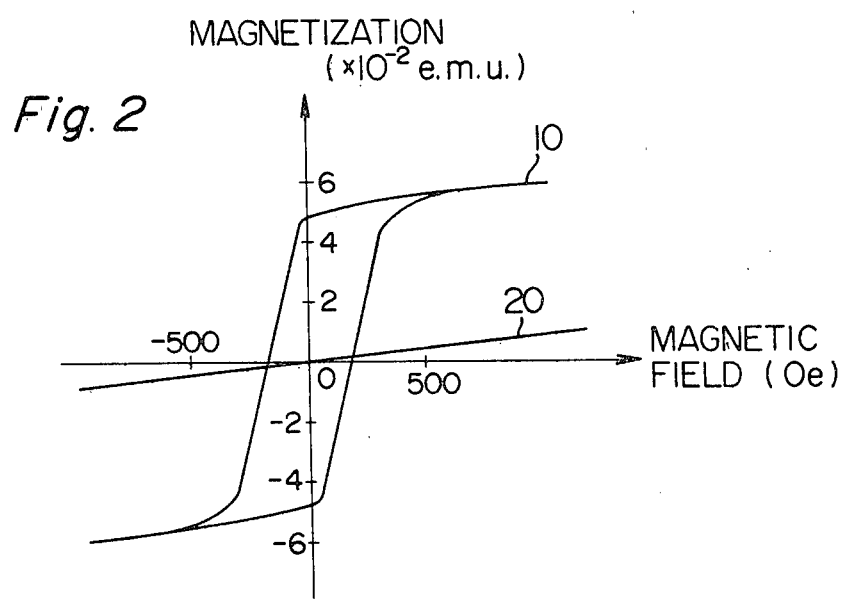
FIG. 2 is a graph showing the magnetization curves of the magnetic recording medium produced in Example 3 of the present application, which are taken in a direction parallel to its surface and in a direction perpendicular to its surface.

The resulting magnetic recording medium was fed into a Vibration-type dc magnetization-measuring device, and its magnetic properties in a direction parallel to the surface of the magnetic recording medium and in a direction perpendicular thereto were measured. The results were plotted in FIG. 2 as magnetization curves. In FIG. 2, the numeral 10 indicates a magnetization curve in the direction parallel to the surface of the recording medium, and the numeral 20, a magnetization curve in the direction perpendicular thereto.

The resulting magnetic recording medium was also fed into an electron spin resonance device, and its ferromagnetic resonance absorption was measured. Consequently, it was ascertained that the axis of easy magnetization of the magnetic recording medium was oriented and distributed in a direction parallel to the surface of the medium.

TABLE 5

| Ionized cluster beam deposition conditions | | |
|---|---|---|
| Vacuum conditions | Initial degree of vacuum | $2 \times 10^{-6}$ torr |
| | Degree of vacuum during deposition | $3.5 \times 10^{-6}$ torr |
| | Material | High purity carbon |
| Crucible conditions | Diameter of the injection nozzle | 0.1 mm |
| | Temperature | 1800° C. |
| | Pressure in the crucible | about 1 torr |
| Cluster ionization conditions | Ionizing voltage | −600 V |
| | Ionizing current | 400 mA |
| Cluster ion accelerating conditions | Accelerating voltage | −2 KV |

TABLE 5-continued

| Ionized cluster beam deposition conditions | | |
|---|---|---|
| | Ion current | 20 μA |

EXAMPLE 4

Using a reactive cluster ion beam deposition apparatus (equipped with oxygen supplying device 9) of the type shown in FIG. 1, 20 g of chromium metal lumps (purity 99.99%) were fed into the closed type crucible 23, and a polyethylene terephthalate film having a thickness of 50 microns was secured to substrate holder 7. Cluster ion beam deposition was performed under the conditions shown in Table 6. Shutter 6 was removed when the generation of cluster ions became uniform.

The thickness of the deposited layer composed mainly of chromium dioxide in the resulting magnetic recording medium, measured by the same method as in Example 1, was about 500 Å.

The deposited layer was analyzed by an X-ray photoelectron spectroscopy, and it was ascertained that chromium dioxide was deposited. The structure of the magnetic domain of the magnetic recording medium was observed by a polarizing microscope, and a fine maze domain was noted.

TABLE 6

| Ionized cluster beam deposition conditions | | |
|---|---|---|
| Vacuum conditions | Initial degree of vacuum | $5 \times 10^{-6}$ torr |
| | Partial pressure of oxygen | $1 \times 10^{-4}$ torr |
| | Material | High purity carbon |
| Crucible conditions | Diameter of the injection nozzle | 0.1 mm |
| | Temperature | 1650° C. |
| | Pressure in the crucible | About $3.5 \times 10^{-1}$ torr |
| Cluster ionization conditions | Ionizing voltage | −600 V |
| | Ionizing current | 100 mA |
| Cluster ion accelerating conditions | Accelerating voltage | −6 KV |
| | Ion current | 300 μA |

EXAMPLE 5

Using the same apparatus as in Example 4, 20 g of chromium metal lumps (purity 99.99%) were fed into the closed type crucible, and deposited on a polyethylene terephthalate film having a thickness of 50 microns by the ionized cluster beam deposition method under the conditions shown in Table 7.

The thickness of the deposited layer, measured in the same way as in Example 1, was about 1400 Å.

The magnetic properties of the resulting magnetic recording medium were measured by a dc magnetization measuring device. It was found to have a saturation magnetic flux density of 3700 gauss, a residual magnetic flux density of 3200 gauss and a coercive force of 550 oersteds.

TABLE 7

| Ionized cluster beam deposition conditions | | |
|---|---|---|
| Vacuum conditions | Initial degree of vacuum | $5 \times 10^{-6}$ torr |
| | Partial pressure of oxygen | $1 \times 10^{-4}$ torr |
| | Material | High purity carbon |
| Crucible | Diameter of the injection | 0.1 mm |

TABLE 7-continued

| Ionized cluster beam deposition conditions | | |
|---|---|---|
| conditions | nozzle | |
| | Temperature | 1650° C. |
| | Pressure in the crucible | about 3.5 × $10^{-1}$ torr |
| Cluster ionization conditions | Ionizing voltage | −600 V |
| | Ionizing current | 300 mA |
| Cluster ion accelerating conditions | Accelerating voltage | −3 KV |
| | Ion current | 300 μA |

What we claim is:

1. A process for producing a magnetic recording medium, which comprises heating a closed type crucible having an injection nozzle and containing at least one ferromagnetic material selected from the group consisting of cobalt, cobalt-containing alloys and mixtures of cobalt with other elements in a vacuum chamber kept at $10^{-3}$ to $10^{-8}$ torr thereby to generate a cluster of the atoms of the ferromagnetic material from the injection nozzle, impinging electron beams generated by an electron beam generator against the cluster to ionize it, accelerating the generated cluster ions in an electric field, and depositing the ions on a substrate composed of a non-magnetic material.

2. A process for producing a magnetic recording medium, which comprises depositing at least one ferromagnetic material selected from the group consisting of cobalt, cobalt-containing alloys and mixtures of cobalt with other elements on a substrate composed of a non-magnetic material by ionized cluster beam deposition in the presence of a magnetic field applied in a direction parallel to the surface of the substrate.

3. A process for producing a magnetic recording medium, which comprises depositing a ferromagnetic material composed predominantly of chromium dioxide on a substrate composed of a non-magnetic material by cluster ion beam deposition.

4. The process of claim 5 which comprises heating a closed type crucible having an injection nozzle and containing metallic chromium or chromium oxide and simultaneously supplying oxygen to the vicinity of the injection nozzle in a vacuum chamber kept at $10^{-3}$ to $10^{-8}$ torr thereby to generate a cluster of metallic chromium or chromium oxide, impinging electron beams generated by an electron beam generator provided within the same vacuum chambber against the cluster thereby to ionize the cluster, accelerating the generated cluster ions in an electric field, and depositing the ions on the substrate.

5. The process of claim 1 or 4 wherein the accelerating voltage in the electric field is −0.1 KV to −15 KV.

6. The process of claim 5 wherein the accelerating voltage in the electric field is −4 KV to −15 KV in the early stage of the ionized cluster beam deposition, and −0.1 KV to −4 KV in the later stage thereof.

* * * * *